(12) United States Patent
Hashimoto et al.

(10) Patent No.: US 10,439,264 B2
(45) Date of Patent: Oct. 8, 2019

(54) WIRELESS DEVICE

(71) Applicant: Kabushiki Kaisha Toshiba, Minato-ku, Tokyo (JP)

(72) Inventors: Koh Hashimoto, Yokohama Kanagawa (JP); Makoto Sano, Kawasaki Kanagawa (JP); Keiju Yamada, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 15/682,372

(22) Filed: Aug. 21, 2017

(65) Prior Publication Data

US 2018/0205133 A1 Jul. 19, 2018

(30) Foreign Application Priority Data

Jan. 17, 2017 (JP) ................. 2017-005986

(51) Int. Cl.
*H01Q 1/22* (2006.01)
*H01Q 13/10* (2006.01)
(Continued)

(52) U.S. Cl.
CPC .......... *H01Q 1/2283* (2013.01); *H01L 23/66* (2013.01); *H01Q 1/36* (2013.01); *H01Q 1/38* (2013.01);
(Continued)

(58) Field of Classification Search
CPC .... H01Q 1/2283; H01Q 25/00; H01Q 13/106; H01Q 1/38; H01Q 21/28; H01Q 1/36;
(Continued)

(56) References Cited

U.S. PATENT DOCUMENTS 7,999,753 B2 * 8/2011 Gaucher ................. H01Q 1/38
343/828
8,111,199 B2 2/2012 Baliarda et al.
(Continued)

FOREIGN PATENT DOCUMENTS

JP  H 10-092981 A  4/1998
JP  2004-242034 A  8/2004
(Continued)

*Primary Examiner* — Graham P Smith
*Assistant Examiner* — Jae K Kim
(74) *Attorney, Agent, or Firm* — Knobbe, Martens, Olson & Bear LLP

(57) ABSTRACT

According to an embodiment, a wireless device includes an interposer, a semiconductor chip, and a non-conductor. The interposer comprises a plurality of conductor layers. The semiconductor chip is mounted on the interposer and comprising a built-in transceiver circuit. The non-conductor is placed on the interposer and seals the semiconductor chip. From among the plurality of conductor layers, a first conductor layer and a second conductor layer are symmetrically positioned with respect to center in a thickness direction of the interposer respectively have a first antenna conductor pattern and a second antenna conductor pattern. The first antenna conductor pattern and the second antenna conductor pattern respectively have a first opening and a second opening functioning as a slot antenna and have substantially equal area of a conductor portion. An orthogonal projection of the first opening onto the second conductor layer overlaps with the second opening.

6 Claims, 13 Drawing Sheets

(51) Int. Cl.
*H01Q 25/00* (2006.01)
*H01L 23/66* (2006.01)
*H01Q 1/38* (2006.01)
*H01Q 1/36* (2006.01)
*H01Q 1/40* (2006.01)
*H01Q 9/06* (2006.01)
*H01Q 9/26* (2006.01)
*H01Q 21/28* (2006.01)

(52) U.S. Cl.
CPC ............ *H01Q 1/405* (2013.01); *H01Q 9/065* (2013.01); *H01Q 9/26* (2013.01); *H01Q 13/106* (2013.01); *H01Q 21/28* (2013.01); *H01Q 25/00* (2013.01); *H01L 2223/6677* (2013.01)

(58) Field of Classification Search
CPC .......... H01Q 1/405; H01Q 9/065; H01Q 9/26; H01L 23/66; H01L 2223/6677
See application file for complete search history.

(56) References Cited

U.S. PATENT DOCUMENTS

| | | | |
|---|---|---|---|
| 8,487,433 B2 | 7/2013 | Hasegawa et al. | |
| 8,983,399 B2 | 3/2015 | Kawamura et al. | |
| 9,793,202 B1 | 10/2017 | Hashimoto et al. | |
| 9,935,065 B1* | 4/2018 | Baheti .................... | H01L 23/66 |
| 2005/0023558 A1* | 2/2005 | Shi ....................... | H01L 23/3121 257/200 |
| 2005/0025927 A1* | 2/2005 | Yoshikawa ........... | H01L 23/315 428/40.1 |
| 2005/0136850 A1* | 6/2005 | Arai ....................... | H04B 1/525 455/88 |
| 2006/0033664 A1 | 2/2006 | Soler Castany et al. | |
| 2007/0209437 A1* | 9/2007 | Xue ...................... | B81B 3/0032 73/514.31 |
| 2009/0256752 A1 | 10/2009 | Akkermans et al. | |
| 2011/0169641 A1* | 7/2011 | Lin ......................... | H01L 23/48 340/572.8 |
| 2011/0309893 A1 | 12/2011 | Kawamura et al. | |
| 2012/0015687 A1 | 1/2012 | Yamada et al. | |
| 2012/0045871 A1* | 2/2012 | Lee ....................... | H01L 23/3128 438/127 |
| 2012/0061826 A1 | 3/2012 | Hasegawa et al. | |
| 2012/0119969 A1* | 5/2012 | MacDonald .......... | H01L 23/552 343/841 |
| 2012/0248587 A1 | 10/2012 | Alleaume et al. | |
| 2013/0222196 A1 | 8/2013 | Hashimoto et al. | |
| 2014/0027906 A1* | 1/2014 | Narita .................... | H01L 23/00 257/738 |
| 2014/0055939 A1 | 2/2014 | Hashimoto et al. | |
| 2014/0325150 A1 | 10/2014 | Hashimoto et al. | |
| 2014/0339313 A1* | 11/2014 | Hammerschmidt ........................ | G06K 19/0704 235/492 |
| 2016/0301125 A1* | 10/2016 | Kim ....................... | G01S 7/032 |
| 2018/0053987 A1 | 2/2018 | Yamada et al. | |
| 2018/0205133 A1 | 7/2018 | Hasimoto et al. | |
| 2018/0226722 A1 | 8/2018 | Yamada et al. | |

FOREIGN PATENT DOCUMENTS

| | | |
|---|---|---|
| JP | 2007-124555 A | 5/2007 |
| JP | 2007-221585 A | 8/2007 |
| JP | 2013-179449 A | 9/2013 |
| JP | 2014-217014 | 11/2014 |
| JP | 5710558 B2 | 4/2015 |
| JP | 2018-023060 | 2/2018 |
| JP | 2018-029286 | 2/2018 |
| JP | 2018-117215 A | 7/2018 |
| JP | 2018-129596 A | 8/2018 |
| WO | WO 2010/058337 | 5/2010 |
| WO | WO 2010/079663 A1 | 7/2010 |

* cited by examiner

WIRELESS DEVICE

CROSS-REFERENCE TO RELATED APPLICATIONS

This application is based upon and claims the benefit of priority from Japanese Patent Application No. 2017-005986, filed on Jan. 17, 2017; the entire contents of which are incorporated herein by reference.

FIELD

Embodiments described herein relate generally to a wireless device.

BACKGROUND

Conventionally, a method is known for having a slot antenna built into a semiconductor package in which a semiconductor chip is mounted on an interposer. Moreover, in order to add a shielding function to the semiconductor package, a technique for implementing a module with a built-in antenna has been proposed in which the surface of an sealing resin for sealing the semiconductor chip is covered using a conductive film; an opening is formed that extends from the conductive film for shielding to a conductive layer of the interposer; and the opening is made to function as a slot antenna.

A slot antenna of the interposer is formed as an opening in a conductor pattern of a conductor layer. Since the shape of the conductor pattern is such that the opening is included therein, it becomes necessary to secure a relatively large space. In the case of forming a slot antenna in an interposer having a plurality of conductor layers, in the areas in which the slot antenna is to be formed, there occur differences in the metal coverage rates of the conductor layers thereby making the interposer susceptible to warpage. Particularly, an interposer is manufactured by arranging a number of interposers on a single substrate. Thus, the warpage occurring in the individual interposers gets accumulated, and the entire interposer tends to have a large warpage. For that reason, there are times when defects occur during the reflow process for mounting components on the interposer, during the resin sealing process or the dicing process in the semiconductor package manufacturing, and the reflow process for mounting the semiconductor package on the mounting interposer. Hence, there has been a demand for effectively reducing the warpage of the interposer.

DETAILED DESCRIPTION

Figure 1:
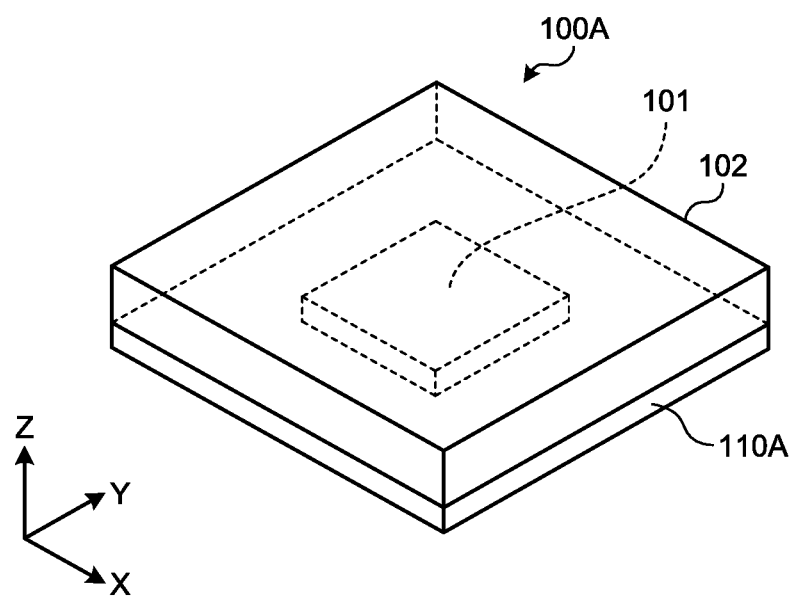
FIG. 1 is a perspective view of a wireless device according to a first embodiment.

According to an embodiment, a wireless device includes an interposer, a semiconductor chip, and a non-conductor. The interposer comprises a plurality of conductor layers. The semiconductor chip is mounted on the interposer and comprising a built-in transceiver circuit. The non-conductor is placed on the interposer and seals the semiconductor chip. From among the plurality of conductor layers of the interposer, a first conductor layer and a second conductor layer are symmetrically positioned with respect to center in a thickness direction of the interposer. The first conductor layer having a first antenna conductor pattern disposed herein and the second conductor layer having a second antenna conductor pattern disposed therein. The first antenna conductor pattern and the second antenna conductor pattern having substantially equal area. The first antenna conductor pattern having a first opening formed therein and the second antenna conductor pattern having a second opening formed therein, the first opening and the second opening functioning as a slot antenna. An orthogonal projection of the first opening onto the second conductor layer overlaps with the second opening.

Embodiments of a wireless device are described below in detail with reference to the accompanying drawings. In the following explanation, the constituent elements having identical functions are referred to by the same reference numerals, and the redundant explanation is not repeated.

First Embodiment

Figure 2:
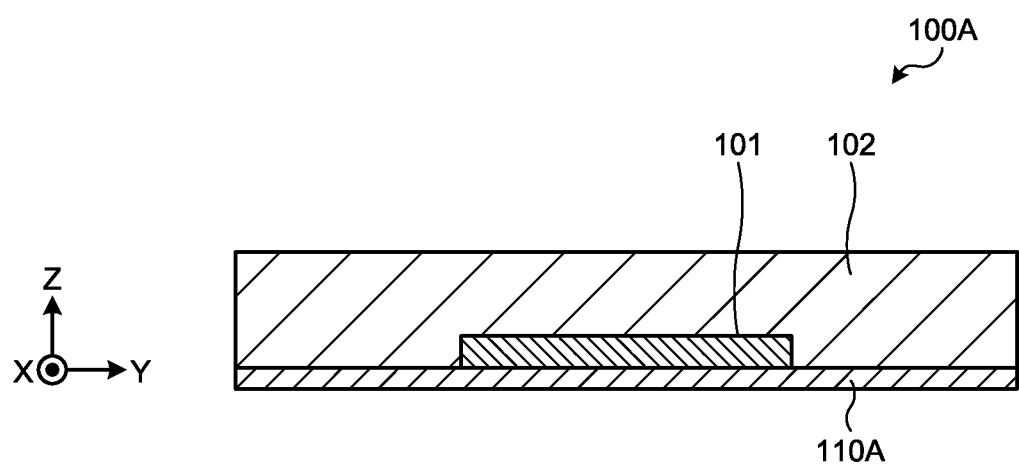
FIG. 2 is a cross-sectional view of the wireless device according to the first embodiment.
Figure 3:
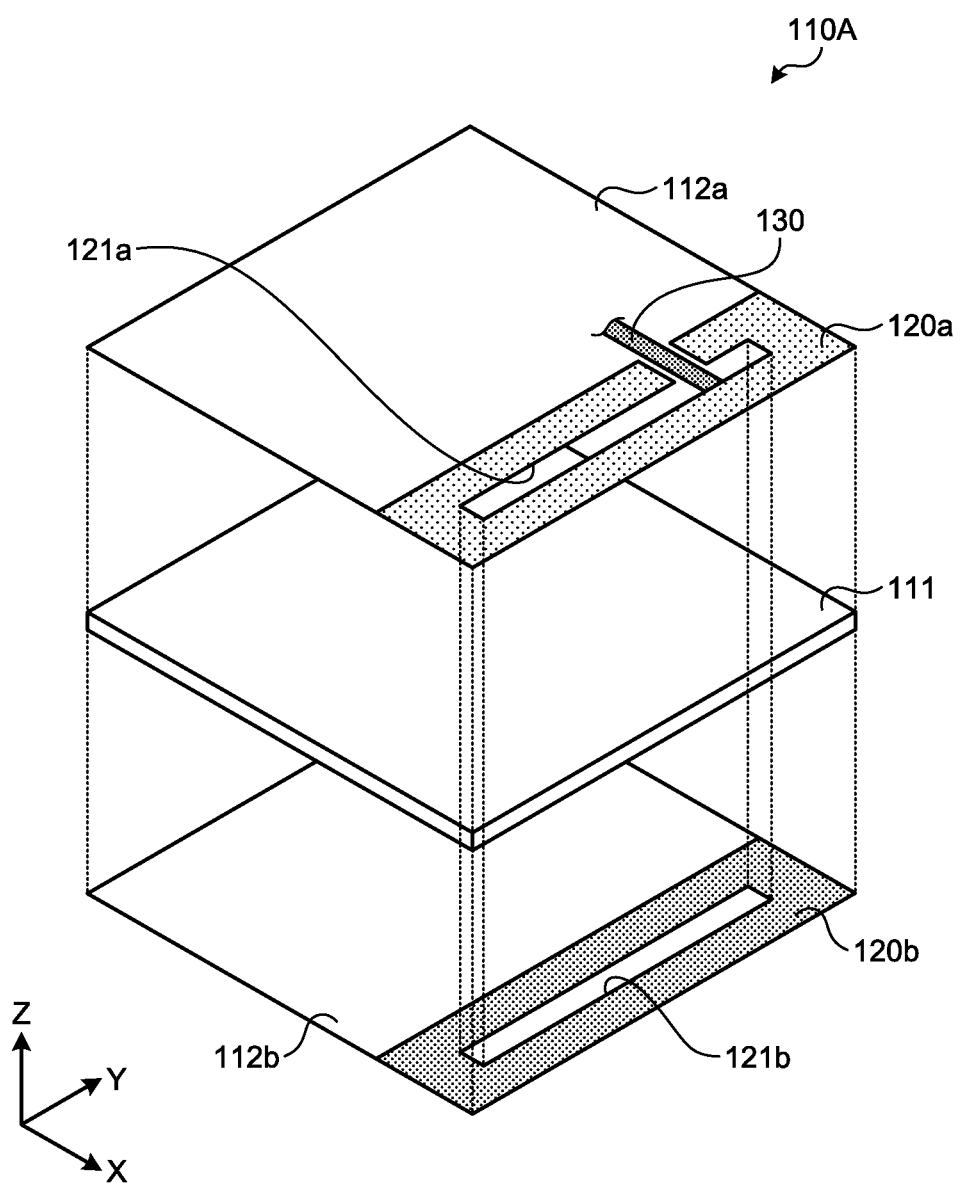
FIG. 3 is an exploded perspective view for explaining a configuration of an interposer.
Figure 4:
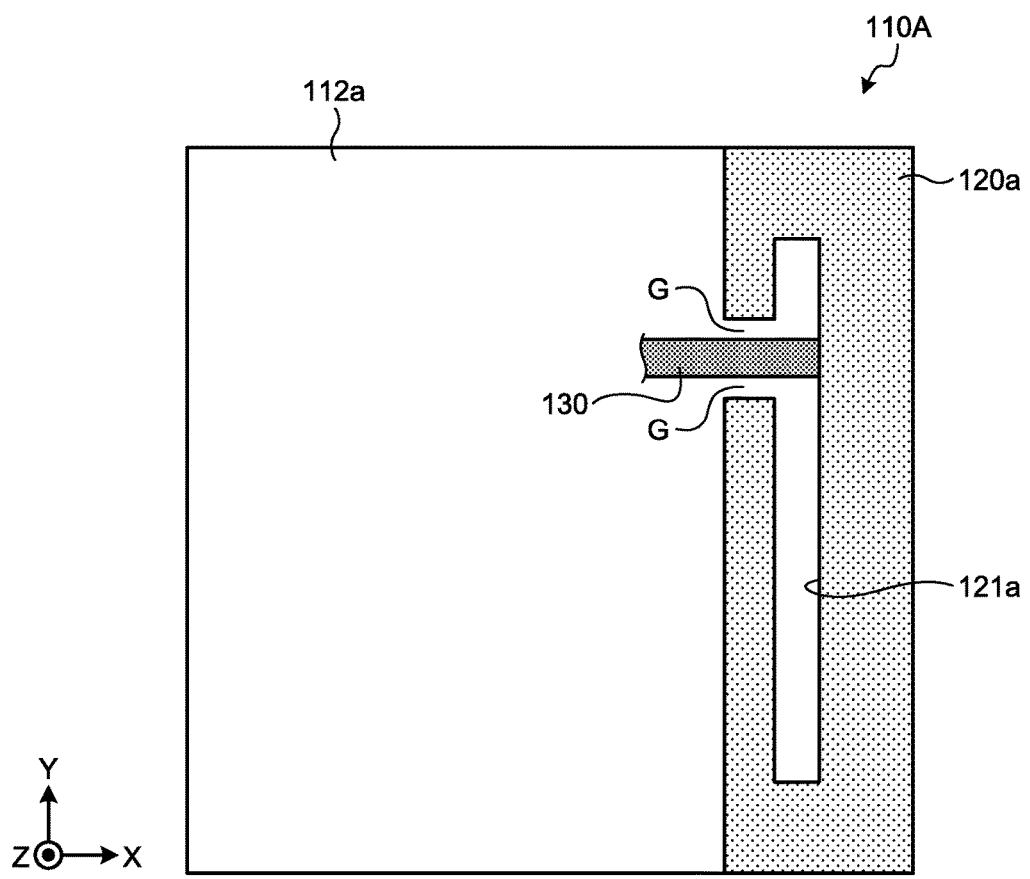
FIG. 4 is a planar view of the interposer.

Firstly, explained below with reference to FIGS. 1 to 4 is a wireless device 100A according to a first embodiment. FIG. 1 is a perspective view of the external appearance of the wireless device 100A according to the first embodiment. FIG. 2 is a cross-sectional view of the wireless device 100A according to the first embodiment. FIG. 3 is an exploded perspective view for explaining a configuration of an interposer 110A of the wireless device 100A according to the first embodiment. FIG. 4 is a planar view of the interposer 110A when viewed from the Z-axis direction illustrated in the drawings.

As illustrated in FIGS. 1 and 2, in the wireless device 100A according to the first embodiment, a semiconductor chip 101 is mounted on the interposer 110A and is sealed using a sealing resin 102. The wireless device 100A having such a configuration is referred to as a semiconductor package or a semiconductor module.

As illustrated in FIG. 3, the interposer 110A is a multi-layered substrate including an insulating base material 111 and a plurality of conductor layers (in the first embodiment, two conductor layers 112a and 112b). The conductor layers 112a and 112b in the interposer 110A are disposed at least at a side of the component installation surface on which components such as the semiconductor chip 101 are installed, and at a side of the reverse surface that is opposite to the component mounting surface. In the conductor layers 112a and 112b, the wiring pattern and ground pattern of the interposer 110A are disposed using a metal such as copper. The interposer 110A functions as a linking member for connecting the components, such as the semiconductor chip 101, mounted thereon to a larger circuit board on which the wireless device 100A is mounted.

In FIG. 3 is illustrated an example of the interposer 110A in which the conductor layers 112a and 112b are disposed on the principal surface portions at the front and rear sides of the insulating base material 111. In order to make the structure easy to understand, a state is illustrated in which the insulating base material 111 and the two conductor layers 112a and 112b are virtually separated from each other. The two conductor layers are symmetrically positioned with respect to the center in the thickness direction of the interposer 110A. Of the two conductor layers 112a and 112b having such a positional relationship, one conductor layer is referred to as a first conductor layer 112a and the other conductor layer is referred to as a second conductor layer 112b.

In the wireless device 100A according to the first embodiment, in the first conductor layer 112a and the second conductor layer 112b of the interposer 110A, antenna conductor patterns 120a and 120b are formed; and the antenna conductor patterns 120a and 120b respectively include openings (slits) 121a and 121b functioning as a slot antenna. In the following explanation, the antenna conductor pattern 120a formed in the first conductor layer 112a is referred to as a first antenna conductor pattern 120a, and the antenna conductor pattern 120b formed in the second conductor layer 112b is referred to as a second antenna conductor pattern 120b. Moreover, the opening 121a of the first antenna conductor pattern 120a is referred to as a first opening 121a, and the opening 121b of the second antenna conductor pattern 120b is referred to as a second opening 121b. The detailed explanation of all these constituent elements is given later.

The semiconductor chip 101 has a metallic pattern of copper, aluminum, or gold formed on the inside or on the surface layer of a semiconductor substrate made of a material such as silicon, silicon germanium, or gallium arsenide; and has an built-in transceiver circuit for transmitting and receiving signals. The semiconductor chip 101 is mounted on the component mounting surface of the interposer 110A; and is electrically connected to the wiring pattern and the ground pattern of the interposer 110A via a bonding wire or a bump.

Alternatively, the semiconductor chip 101 can be configured using a dielectric substrate, a magnetic substrate, a metal, or a combination thereof. Still alternatively, the semiconductor chip 101 can be configured as a chip size package (CSP). Meanwhile, in FIGS. 1 and 2, although it is illustrated that a single semiconductor chip 101 is mounted on the interposer 110A, it is also possible to have a plurality of semiconductor chips 101 mounted on the interposer 110A. In that case, the semiconductor chips 101 either can be stacked or can be horizontally arranged. Moreover, in FIGS. 1 and 2, although only the semiconductor chip 101 is illustrated to have been mounted on the interposer 110A, other components such as a chip capacitor, a resistance, an inductor, and an integrated circuit (IC) can also be mounted on the interposer 110A in addition to the semiconductor chip 101.

The sealing resin 102 is made of, for example, a thermosetting molding compound having epoxy resin as the base with silica filler added thereto; and is placed on the component mounting surface of the interposer 110A for the purpose of protecting the semiconductor chip 101, and thus seals the semiconductor chip 101. Herein, the sealing resin 102 is an example of a non-conductor used for sealing the semiconductor chip 101. However, the non-conductor is not limited to resin, and some other non-conductive material or insulating material can alternatively be used.

As illustrated in FIG. 3, the first antenna conductor pattern 120a and the second antenna conductor pattern 120b are formed to have the substantially same shape in such areas (hereinafter, called antenna areas) in the first conductor layer 112a and the second conductor layer 112b, respectively, which are predetermined for placing a slot antenna. In the example illustrated in FIG. 3, although the first antenna conductor pattern 120a and the second antenna conductor pattern 120b are rectangular in shape, they can be polygonal in shape or can have a complex shape including curved lines in some portion.

In the wireless device 100A according to the first embodiment, the first opening 121a and the second opening 121b are respectively formed in the first antenna conductor pattern 120a and the second antenna conductor pattern 120b, thereby constituting a slot antenna. Regarding the first opening 121a and the second opening 121b, the length in the longitudinal direction is substantially equal to the half wavelength of the desired frequency used for communication by the wireless device 100A. When at least either the first opening 121a or the second opening 121b (in the example illustrated in FIG. 3, the first opening 121a) receives coplanar power supply from an antenna feeder 130, the first opening 121a and the second opening 121b function as a slot antenna and become able to radiate or receive electromagnetic waves of the desired frequency in an efficient manner. In the example illustrated in FIG. 3, although the first opening 121a and the second opening 121b are rectangular in shape, they can be of the L shape, the horseshoe shape, the meander shape, or some other complex shape according to the usable frequency, the desired radiation direction, and the shape of the antenna areas.

The antenna feeder 130, the first antenna conductor pattern 120a, and the second antenna conductor pattern 120b constitute a grounded coplanar line in which the first antenna conductor pattern 120a serves as side ground and the second antenna conductor pattern 120b serves as rear ground. Since the antenna feeder 130 feeds power to the first opening 121a; as illustrated in FIG. 4, the antenna feeder 130 extends in an intersecting manner with the first opening 121a and has the leading end thereof connected to the first antenna conductor pattern 120a. Moreover, regarding the remaining portion other than the leading end of the antenna feeder 130, gaps G are maintained in order to insulate the antenna feeder 130 from the first antenna conductor pattern 120a. Meanwhile, in FIGS. 3 and 4, although the base end side of the antenna feeder 130 is not illustrated, it is connected to an RF input-output of the semiconductor chip 101 via a bump or a bonding wire.

In order to reduce the warpage of the interposer 110A, the metal coverage rates of the first conductor layer 112a and the second conductor layer 112b need to be maintained at a comparable level. However, for convenience of placement of the signal wiring and the ground pattern, there are cases where the metal coverage rates differ among different conductor layers. In such a case, a widely-used countermeasure is to arrange, in a mesh-like shape or a land array shape, a dummy conductor pattern not having electrical functions, so as to maintain the metal coverage rates among different conductor layers at a comparable level.

However, in the case of arranging a dummy pattern in an antenna area of the interposer 110A, since the dummy pattern has an adverse impact on the antenna characteristic, there are limitations on the arrangement of the dummy pattern. That is, generally, a slot antenna is formed as an opening of a conductor pattern within an antenna area. Consequently, the conductor pattern requires a relatively large area, and the metal coverage rates among different conductor layers easily become different. When a dummy pattern is arranged in an antenna area with the aim of holding down the differences in the metal coverage rates of different conductor layers, if the dummy conductor pattern is placed within the area of orthogonal projection from an opening, which functions as a slot antenna, onto another conductor layer; then the antenna characteristic of the slot antenna deteriorates in a significant way. On the other hand, with the aim of ensuring that the antenna characteristic of the slot antenna does not deteriorate, if a restriction is applied for not placing a dummy pattern within the area of orthogonal projection from the opening functioning as a slot antenna onto another conductor layer, then the differences in the metal coverage rates of different conductor layers in the antenna areas still remain in spite of adjusting the metal coverage rates by placing the dummy pattern.

In contrast, in the wireless device 100A according to the first embodiment, the first antenna conductor pattern 120a, which is disposed in the first conductor layer 112a of the interposer 110A, has the substantially same shape as the second antenna conductor pattern 120b, which is disposed in the second conductor layer 112b of the interposer 110A. Moreover, the first opening 121a of the first antenna conductor pattern 120a has the substantially same shape as the second opening 121b of the second antenna conductor pattern 120b. Hence, the first antenna conductor pattern 120a and the second antenna conductor pattern 120b have the substantially equal area of the conductor portion.

Furthermore, the first opening 121a of the first antenna conductor pattern 120a and the second opening 121b of the second antenna conductor pattern 120b are formed at the substantially same position in the respective antenna areas. That is, the orthogonal projection of the first opening 121a onto the second conductor layer 112b overlaps with the second opening 121b. In other words, in the planar view of the interposer 110A when viewed from the direction orthogonal to the principal surface (i.e., when viewed from the Z-axis direction illustrated in the drawings), the first opening 121a and the second opening 121b are seen to be overlapping with each other.

In the wireless device 100A according to the first embodiment, the first antenna conductor pattern 120a and the second antenna conductor pattern 120b having the above-mentioned configuration are arranged in the antenna areas of the first conductor layer 112a and the second conductor layer 112b, respectively, of the interposer 110A. As a result, the metal coverage rates in the antenna areas of the interposer 110A can be maintained at a comparable level between the first conductor layer 112a and the second conductor layer 112b. As a result, the stress generated at the interface between the insulating base material 111 and the first conductor layer 112a is cancelled out by the stress generated at the interface between the insulating base material 111 and the second conductor layer 112b, thereby enabling achieving reduction in the warpage of the interposer 110A. Moreover, since no dummy conductor pattern is placed within the orthogonal projection of the first opening 121a or the second opening 121b onto another conductor layer, it becomes possible to effectively prevent a situation in which the antenna characteristic of the slot antenna deteriorates due to the effect of such a conductor. In this way, in the wireless device 100A according to the first embodiment, the warpage of the interposer 110A can be effectively reduced while maintaining the antenna characteristic of the slot antenna at an excellent level.

Meanwhile, in order to reduce the warpage of the interposer 110A, regarding the other portion of the interposer 110A other than the antenna areas, it is also desirable to have the metal coverage rates of different conductor layers to be at a comparable level. In the other portion of the interposer 110A other than the antenna areas, even if a dummy conductor pattern is disposed, the effect on the antenna characteristic is small. Hence, by placing a dummy pattern according to the conventional method, the metal coverage rates of different conductor layers can be maintained at a comparable level.

The wireless device 100A according to the first embodiment described above is configured as, for example, a package or a module having the ball grid array (BGA) structure in which terminals formed by solder balls are disposed on the reverse surface side of the interposer 110A. Alternatively, without disposing the terminals formed by solder balls, the wireless device 100A can be configured as a package or a module having the land grid array (LGA) structure in which lands disposed at the side of the reverse surface of the interposer 110A are used as terminals. Meanwhile, in FIGS. 1 to 4, although the wireless device 100A is illustrated to have a quadrangular planar shape, the outer shape of the wireless device 100A is not limited to this example, and it is possible to have the wireless device 100A in various shapes.

As described above, in the wireless device 100A according to the first embodiment, in the antenna areas of the interposer 110A, the first conductor layer 112a and the second conductor layer 112b respectively have the first antenna conductor pattern 120a and the second antenna conductor pattern 120b disposed therein having the substantially equal area of the conductor portion. Moreover, the orthogonal projection of the first opening 121a, which is formed in the first antenna conductor pattern 120a, onto the second conductor layer 112b overlaps with the second opening 121b formed in the second antenna conductor pattern 120b. Hence, according to the first embodiment, the metal coverage rates of the first conductor layer 112a and the second conductor layer 112b can be maintained at a comparable level without causing significant deterioration in the antenna characteristic of the slot antenna. As a result, an excellent antenna characteristic can be achieved along with achieving a decrease in the warpage of the interposer 110A.

Moreover, in the first embodiment, as the feeder line to the slot antenna, a grounded coplanar line is used that is insusceptible to the external environment. For that reason, at the time of mounting the wireless device 100A, the effect on the antenna characteristic attributed to the environment can be reduced in an effective manner. Moreover, as compared to a microstrip line, the grounded coplanar line enables adjustment of the characteristic impedance over a wide range. Hence, at the time of feeding power to the slot antenna, it becomes easier to achieve impedance matching. Meanwhile, in the first conductor layer 112a, the gaps G with the antenna feeder 130 are maintained. Hence, although the metal coverage rates in the antenna areas of the first conductor layer 112a and the second conductor layer 112b are not strictly same, the difference therebetween is at an ignorable level. For that reason, even in the configuration in which power to the slot antenna is fed using a grounded coplanar line, the warpage of the interposer 110A can be reduced in an effective manner.

First Modification

The interposer 110A illustrated in FIGS. 3 and 4 is configured to include two conductor layers. Alternatively, it is also possible to configure the interposer 110A to include three or more conductor layers and include two or more insulating base materials placed in between the conductor layers. Generally, in a multilayered substrate including three of more layers; a plurality of cores, in each of which conductor layers are formed in advance at the front and reverse sides of an insulator, is bonded using prepreg made of an insulator. Moreover, instead of using prepreg, sometimes a bonding film made of an insulator is also used. In that case, the insulators of the cores along with prepreg or a bonding film correspond to the insulating base material 111 of the interposer 110A.

Figure 5:
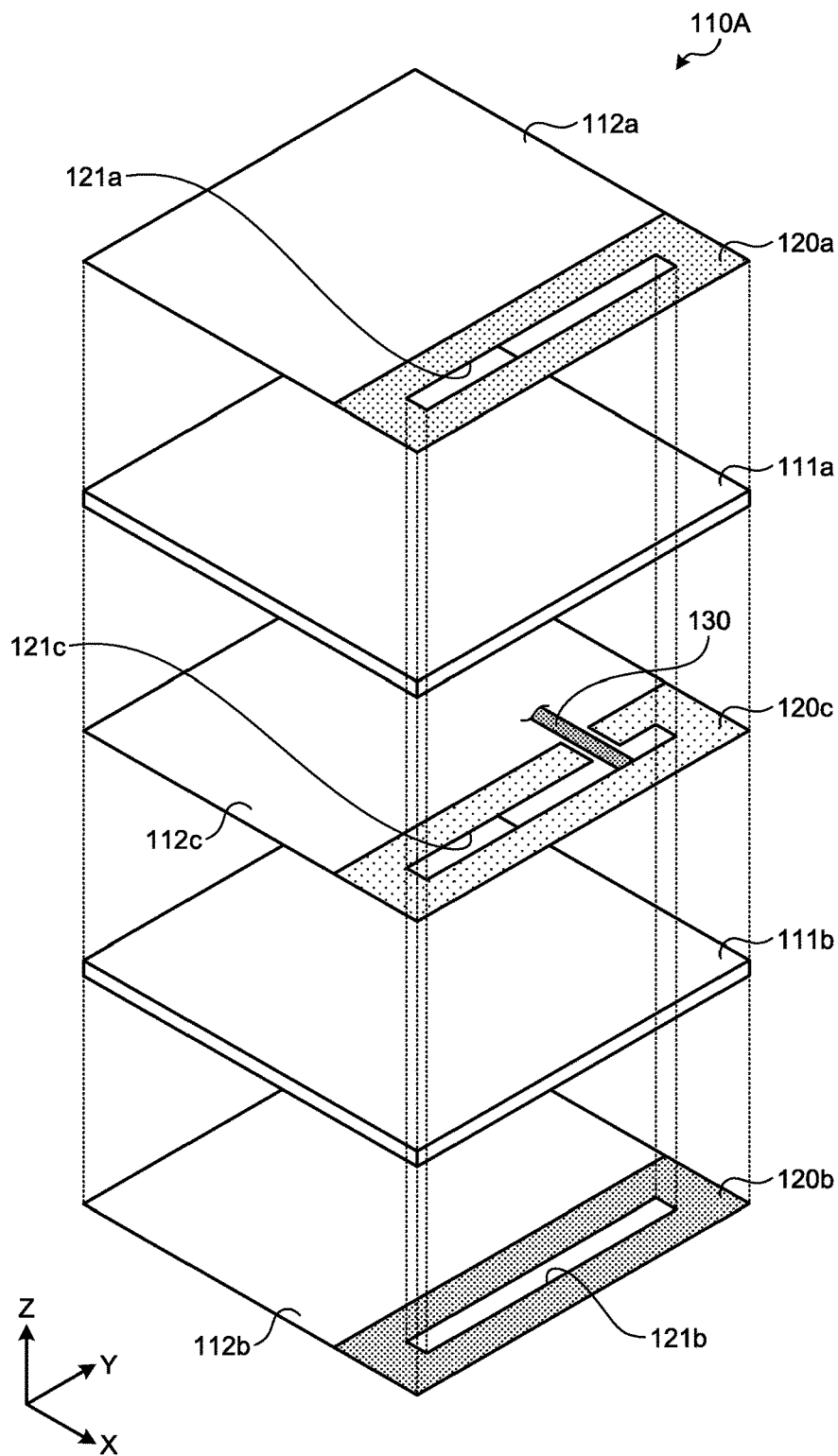
FIG. 5 is an exploded perspective view for explaining a configuration of the interposer.
Figure 6:
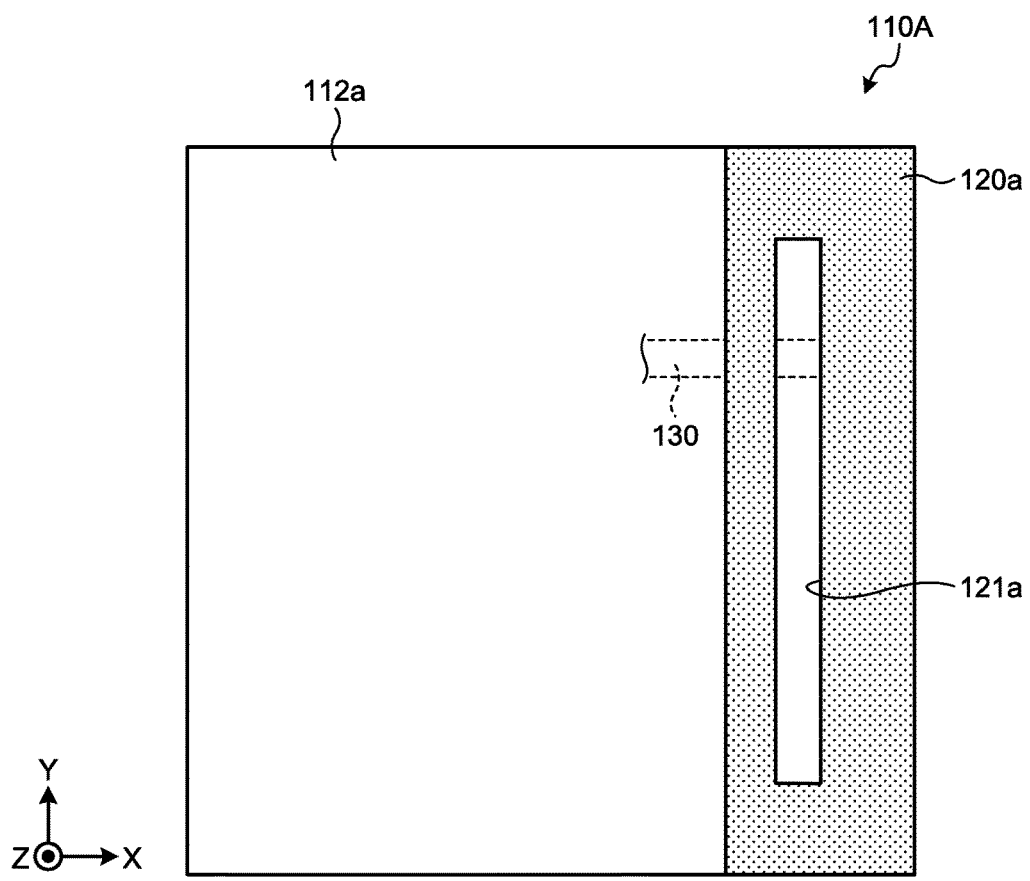
FIG. 6 is a planar view of the interposer.

FIGS. 5 and 6 are diagrams illustrating an example of the interposer 110A having three conductor layers. FIG. 5 is an exploded perspective diagram for explaining a configuration of the concerned interposer 110A. FIG. 6 is a planar view of the concerned interposer 110A when viewed from the Z-axis direction illustrated in the drawings.

As illustrated in FIG. 5, in the interposer 110A according to the first modification, two insulating base materials 111a and 111b are placed in between the first conductor layer 112a and the second conductor layer 112b; and a third conductor layer 112c is disposed in between the two insulating base materials 111a and 111b (i.e., disposed at the center in the width direction of the interposer 110A). Moreover, in the antenna area of the third conductor layer 112c, a third antenna conductor pattern 120c is formed that is identical to the first antenna conductor pattern 120a and the second antenna conductor pattern 120b. The third antenna conductor pattern 120c has a third opening 121c formed therein that is identical to the first opening 121a and the second opening 121b.

Furthermore, in the interposer 110A according to the first modification, the antenna feeder 130 is disposed in the third conductor layer 112c. When the third opening 121c of the third antenna conductor pattern 120c receives coplanar power supply from the antenna feeder 130; the first opening 121a, the second opening 121b, and the third opening 121c function as a slot antenna and become able to radiate or receive electromagnetic waves of the desired frequency in an efficient manner.

The antenna feeder 130 disposed in the third conductor layer 112c, the first antenna conductor pattern 120a disposed in the first conductor layer 112a, and the second antenna conductor pattern 120b disposed in the second conductor layer 112b constitute a stripline in which the first antenna conductor pattern 120a and the second antenna conductor pattern 120b serve as ground. In an identical manner to the grounded coplanar line explained earlier, the stripline is insusceptible to the external environment. Hence, if the stripline is used as the feedline for the slot antenna, at the time of mounting the wireless device 100A, the impact of the environment on the antenna characteristic can be reduced in an effective manner.

In the interposer 110A according to the first modification; the first opening 121a of the first antenna conductor pattern 120a, the second opening 121b of the second antenna conductor pattern 120b, and the third opening 121c of the third antenna conductor pattern 120c are formed at the substantially same position in the respective antenna areas. That is, in the planar view of the interposer 110A when viewed from the direction orthogonal to the principal surface (i.e., when viewed from the Z-axis direction illustrated in the drawings), the first opening 121a, the second opening 121b, and the third opening 121c are seen to be overlapping with each other.

Thus, even in the case of using the interposer 110A according to the first modification instead of using the interposer 110A described earlier, the metal coverage rates of the first conductor layer 112a and the second conductor layer 112b can be maintained at a comparable level without causing significant deterioration in the antenna characteristic of the slot antenna. As a result, an excellent antenna characteristic can be achieved along with achieving a decrease in the warpage of the interposer 110A.

Figure 7:
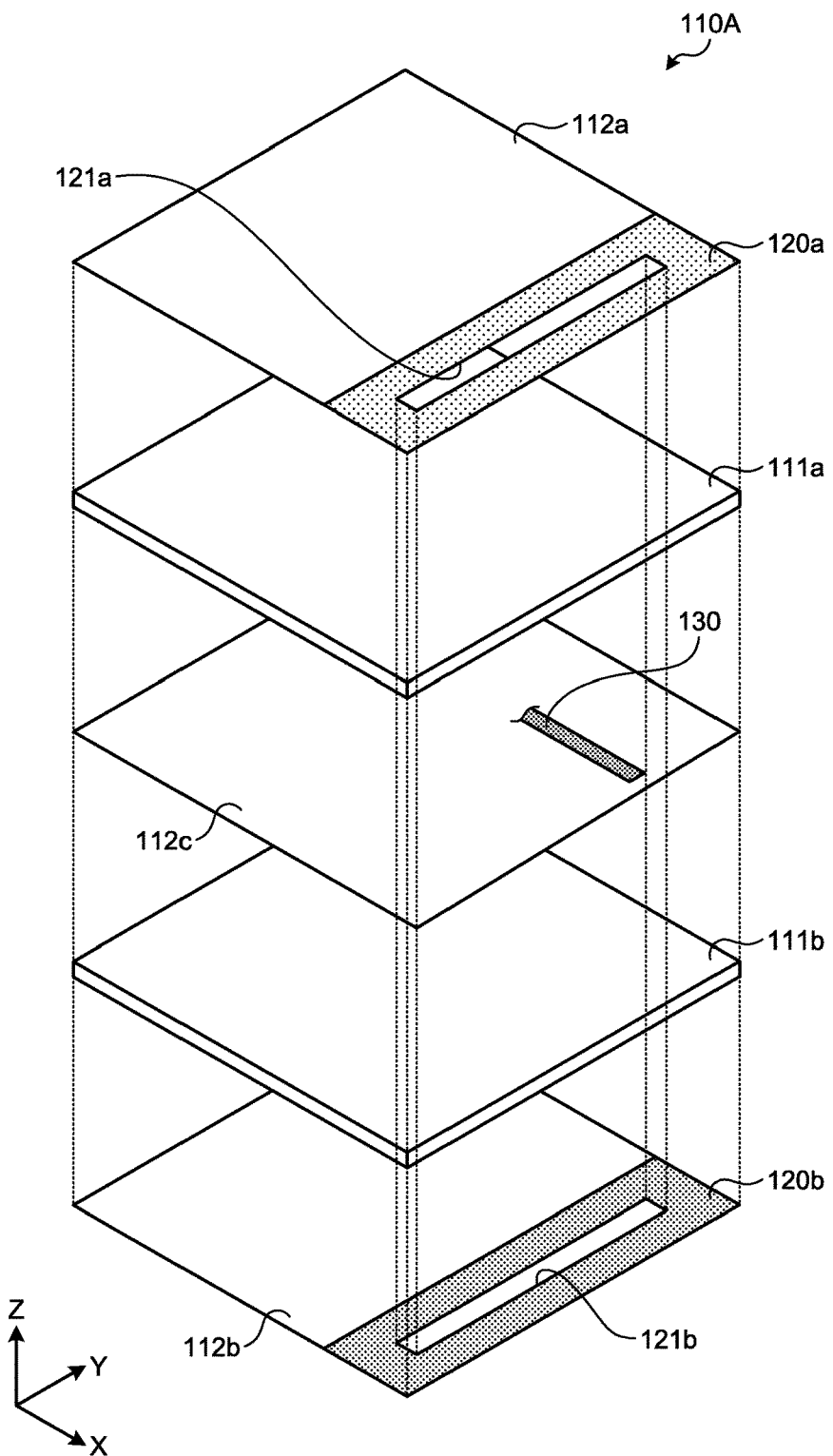
FIG. 7 is an exploded perspective view for explaining a configuration of the interposer.

In the example explained above, the third antenna conductor pattern 120c is disposed in the third conductor layer 112c. Alternatively, as illustrated in FIG. 7, the configuration can be such that no antenna conductor pattern is disposed in the third conductor layer 112c. In the interposer 110A illustrated in FIG. 7, in the third conductor layer 112c in which no antenna conductor layer is disposed, the antenna feeder 130 is disposed that performs electromagnetic-field-coupling-type power feeding so as to feed power to the first opening 121a and the second opening 121b functioning as a slot antenna. Meanwhile, instead of disposing the antenna feeder 130 in the third conductor layer 112c, the antenna feeder 130 can alternatively be disposed in the first conductor layer 112a or the second conductor layer 112b. With that, a grounded coplanar line can be configured and coplanar power feeding can be performed.

Meanwhile, although the interposer 110A having three conductor layers is illustrated, the interposer 110A having four or more conductor layers can also be configured. In that case too, regarding the two conductor layers that are symmetrically positioned with respect to the center in the thickness direction of the interposer 110A, one conductor layer is referred to as the first conductor layer 112a and the other conductor layer is referred to as the second conductor layer 112b; and the first antenna conductor pattern 120a and the second antenna conductor pattern 120b are formed in the first conductor layer 112a and the second conductor layer 112b, respectively. With that, an excellent antenna characteristic can be achieved along with achieving a decrease in the warpage of the interposer 110A.

Second Modification

In the interposer 110A illustrated in FIGS. 3 and 4, the first opening 121a and the second opening 121b have the substantially same shape and are formed at the substantially same position in the respective antenna areas. However, in the interposer 110A, as long as the orthogonal projection of the first opening 121a onto the second conductor layer 112b overlaps with the second opening 121b, the first opening 121a can be slightly smaller in size than the second opening 121b.

Figure 8:
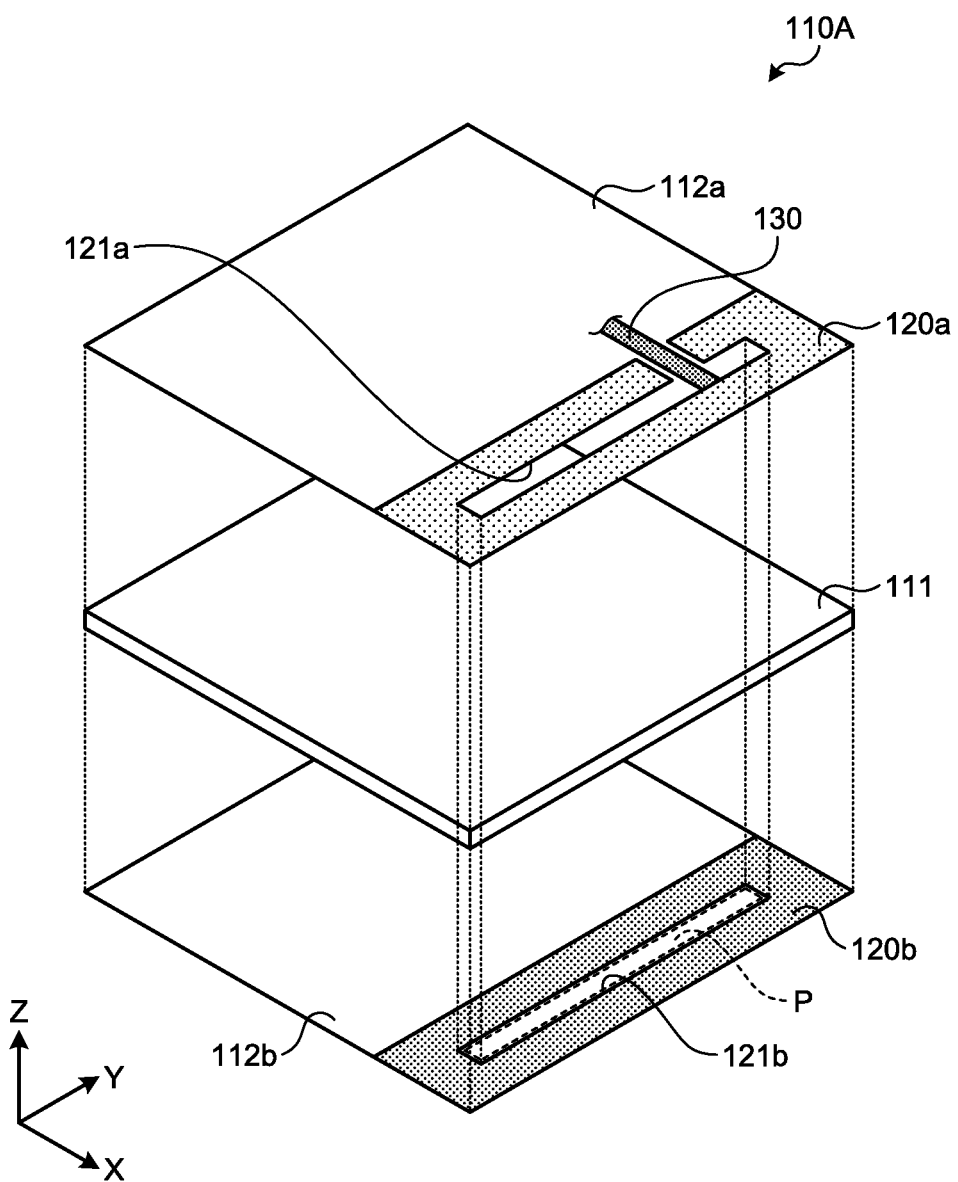
FIG. 8 is an exploded perspective view for explaining a configuration of the interposer.
Figure 9:
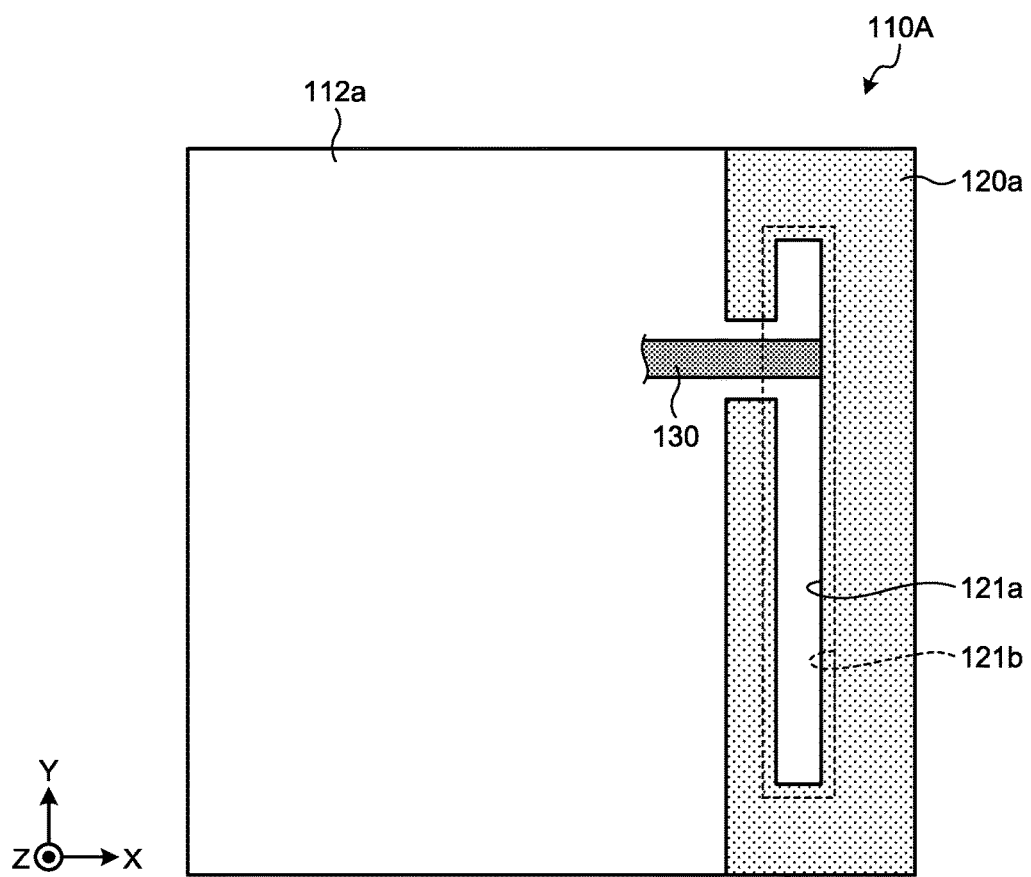
FIG. 9 is a planar view of the interposer.

FIGS. 8 and 9 are diagrams illustrating the interposer 110A according to the second modification. FIG. 8 is an exploded perspective view for explaining a configuration of the interposer 110A according to the second modification. FIG. 9 is a planar view of the interposer 110A according to the second modification when viewed from the Z-axis direction illustrated in the drawings.

In the interposer 110A according to the second modification, as illustrated in FIGS. 8 and 9, the first opening 121a of on the first antenna conductor pattern 120a, which receives coplanar power supply from the antenna feeder 130, is slightly smaller in size than the second opening 121b of the second antenna conductor pattern 120b. That is, an orthogonal projection P (see FIG. 8) of the first opening 121a onto the second conductor layer 112b falls within the second opening 121b.

Since the interposer 110A is a multilayered substrate including a plurality of conductor layers, there are cases where misalignment occurs among the conductor layers during manufacturing. Although the misalignment is only small in amount, if the first opening 121a and the second opening 121b have the same size, then the misalignment among the conductor layers causes changes in the antenna characteristic of the slot antenna. That is, in the planar view of the interposer 110A when viewed from the direction orthogonal to the principal surface, the overlapping area between the first opening 121a and the second opening 121b represents the effective dimensions of the slot antenna. However, if the first opening 121a and the second opening 121b have the same size, then the size of the overlapping area changes due to the misalignment among the conductor layers, and the antenna characteristic also undergoes changes.

In contrast, in the interposer 110A according to the second modification, when the first opening 121a is formed to be slightly smaller in size than the second opening 121b, and when the orthogonal projection P of the first opening 121a onto the second conductor layer 112b falls within the second opening 121b; even if there occurs misalignment among the conductor layers during manufacturing of the substrate, the effective dimension of the slot antenna is maintained at the dimension of the first opening 121a. Thus, it becomes possible to effectively prevent an unfavorable situation in which the antenna characteristic undergoes changes due to the misalignment among the conductor layers during manufacturing of the substrate. Herein, the difference in the sizes of the first opening 121a and the second opening 121b can be determined by taking into account the tolerance of the misalignment among the conductor layers during manufacturing of the substrate. Since there is only a slight difference in the sizes of the first opening 121a and the second opening 121b, the metal coverage rates of the first opening 121a and the second opening 121b are maintained at a comparable level.

As described above, in the second modification too, the metal coverage rates of the first opening 121a and the second opening 121b are maintained at a comparable level. As a result, an excellent antenna characteristic can be achieved along with achieving a decrease in the warpage of the interposer 110A. Moreover, in the second modification, since there is an enhancement in the robustness of the antenna characteristic against the misalignment among the conductor layers, it becomes possible to enhance the yield during the substrate manufacturing process.

Third Modification

The interposer 110A has a parallel plate structure in which a plurality of conductor patterns is formed. Hence, when the slot antenna radiates or receives electromagnetic waves, there is a possibility of leakage of some electromagnetic waves inside the parallel plate structure. In the interposer 110A according to a third modification, the first antenna conductor pattern 120a, which is disposed in the first conductor layer 112a, and the second antenna conductor pattern 120b, which is disposed in the second conductor layer 112b, are electrically connected via conductive via holes; and the leakage of electromagnetic waves is suppressed.

Figure 10:
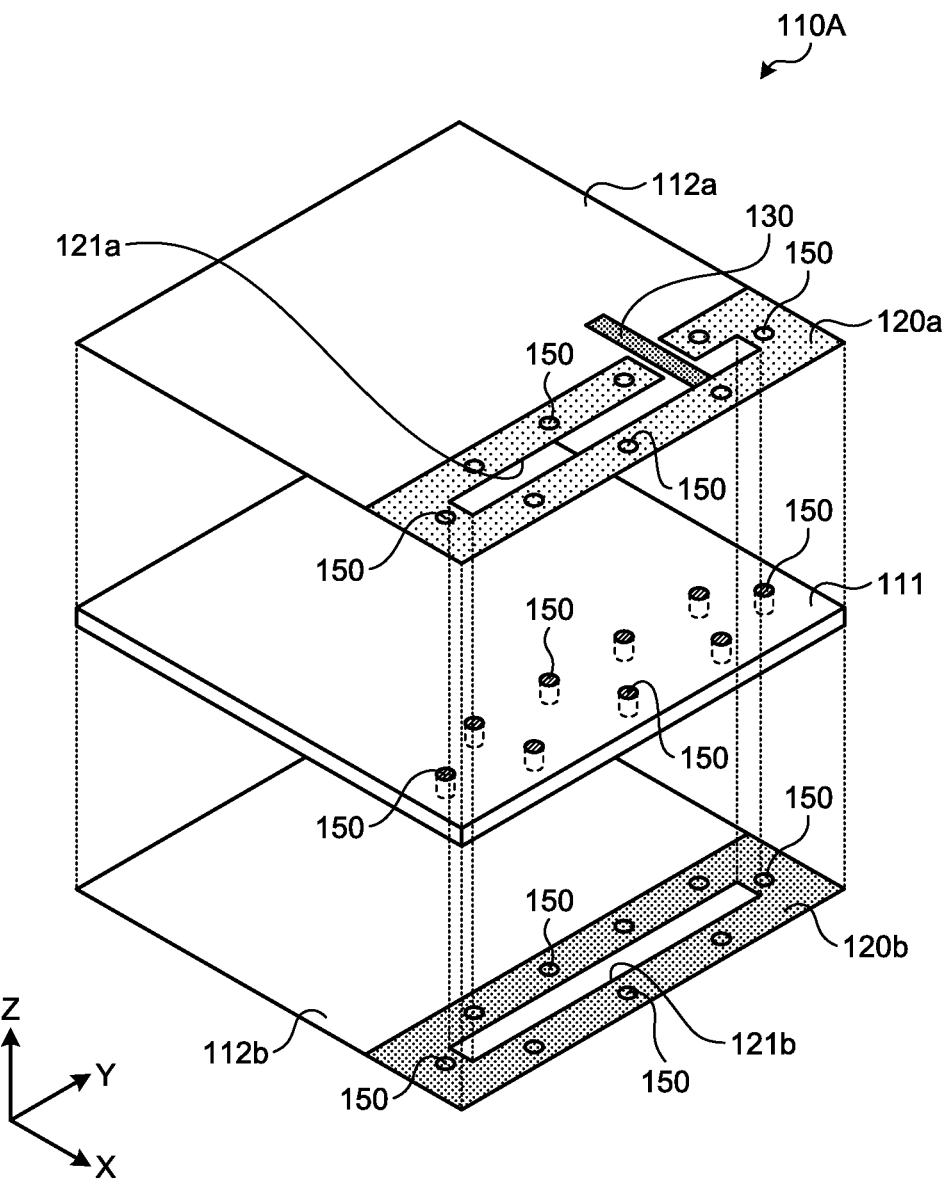
FIG. 10 is an exploded perspective view for explaining a configuration of the interposer.
Figure 11:
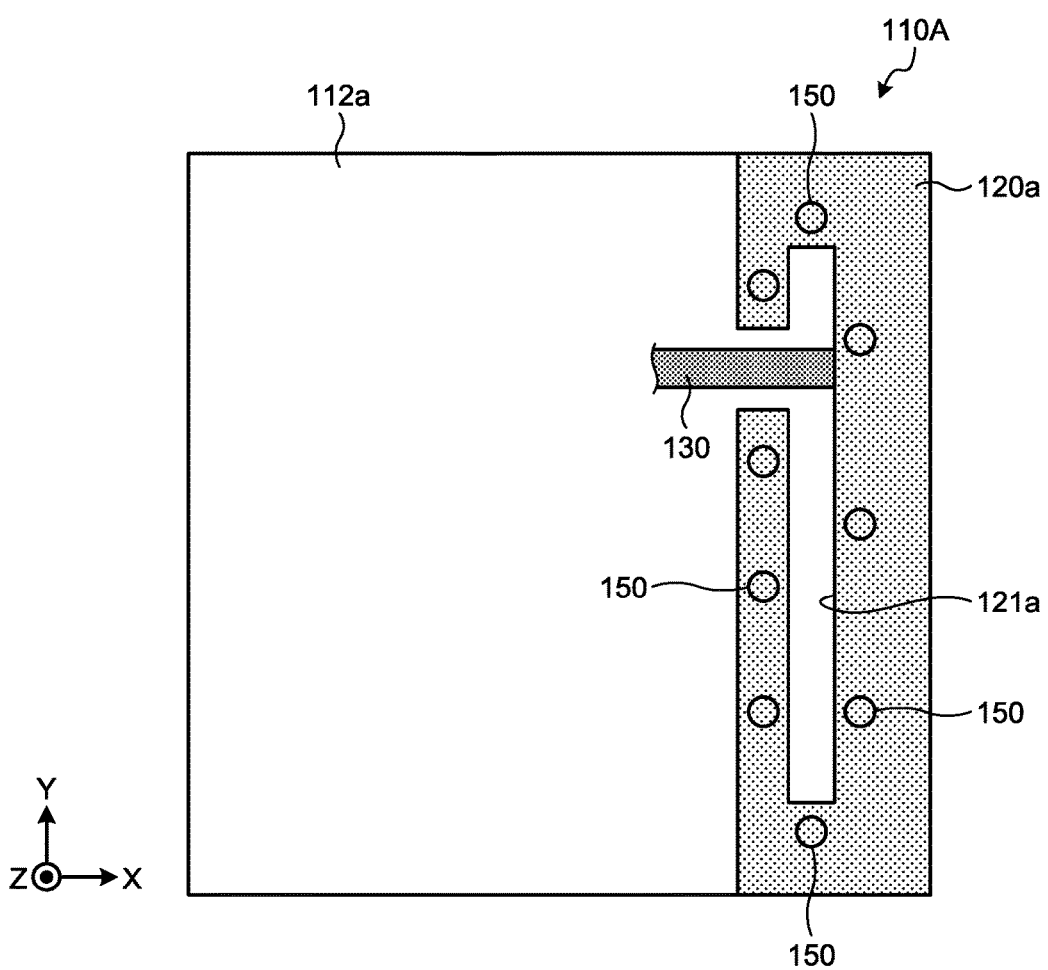
FIG. 11 is a planar view of the interposer.

FIGS. 10 and 11 are diagrams illustrating the interposer 110A according to the third modification. FIG. 10 is an exploded perspective view for explaining a configuration of the interposer 110A according to the third modification. FIG. 11 is a planar view of the interposer 110A according to the third modification when viewed from the Z-axis direction illustrated in the drawings.

In the interposer 110A according to the third modification, as illustrated in FIGS. 10 and 11, conductive via holes 150 that electrically connect the first antenna conductor pattern 120a to the second antenna conductor pattern 120b are disposed to penetrate through the insulating base material 111 across the first conductor layer 112a and the second conductor layer 112b. The conductive via holes 150 are disposed at the periphery of the first opening 121a and the second opening 121b, and surround the first opening 121a and the second opening 121b. With such a configuration, it becomes possible to effectively suppress the leakage of electromagnetic waves in the parallel plate structure, thereby resulting in further enhancement of the antenna characteristic of the slot antenna. Moreover, in the third modification too, since the metal coverage rates of the first opening 121a and the second opening 121b are maintained at a comparable level, an excellent antenna characteristic can be achieved along with achieving a decrease in the warpage of the interposer 110A.

Second Embodiment

Figure 12:
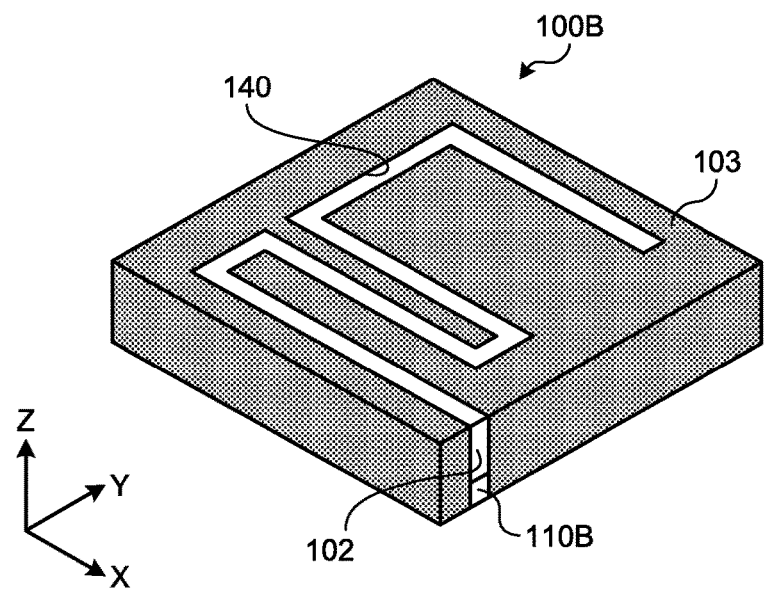
FIG. 12 is a perspective view of a wireless device according to a second embodiment.
Figure 13:
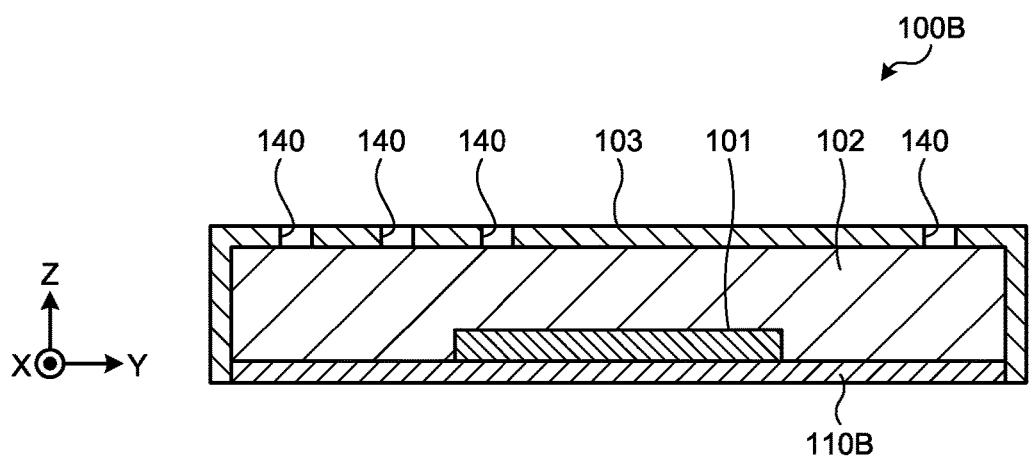
FIG. 13 is a cross-sectional view of the wireless device according to the second embodiment.
Figure 14:
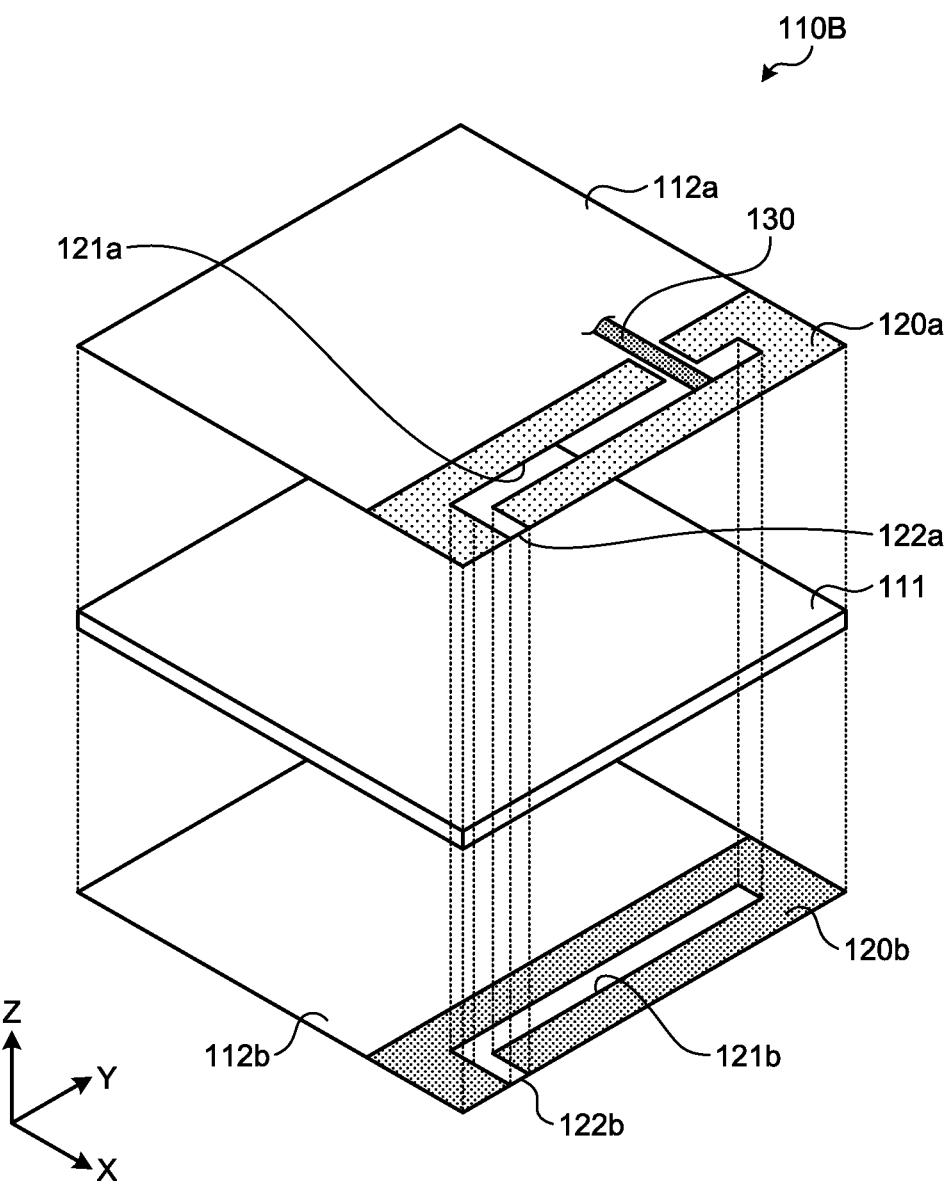
FIG. 14 is an exploded perspective view for explaining a configuration of an interposer.
Figure 15:
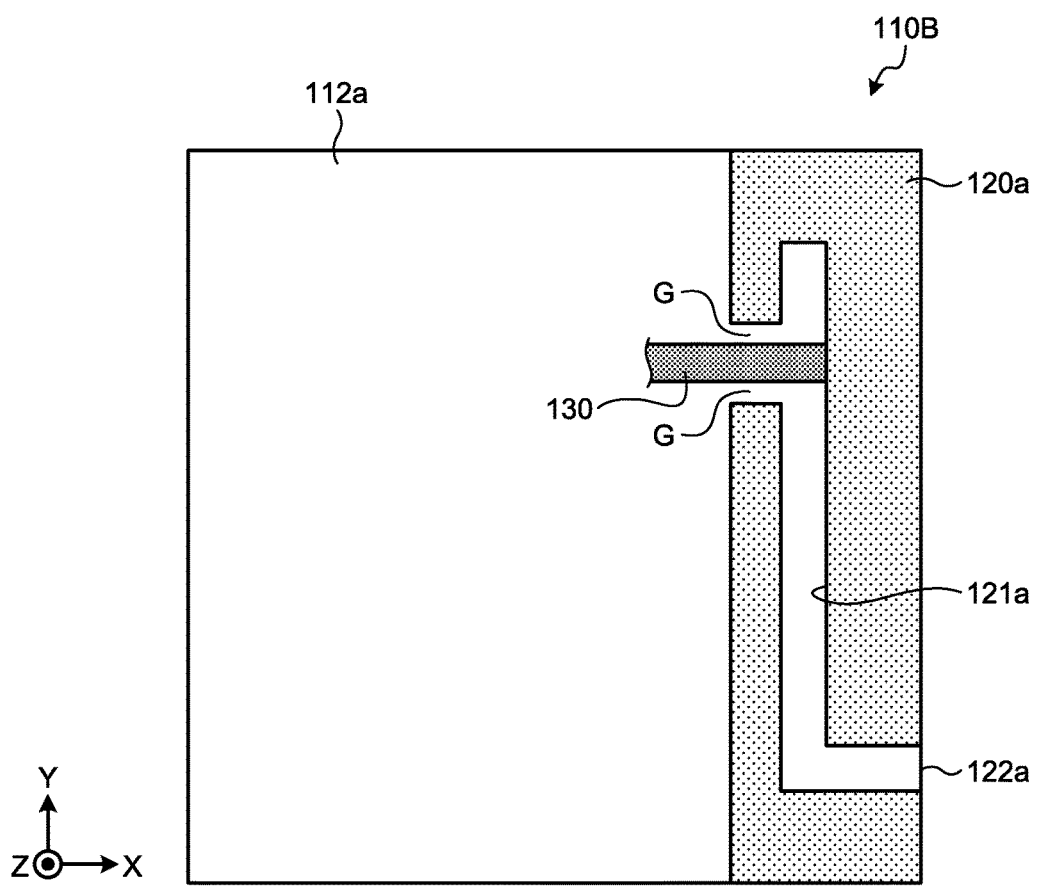
FIG. 15 is a planar view of the interposer.

Explained below with reference to FIGS. 12 to 15 is a wireless device 100B according to a second embodiment. FIG. 12 is a perspective view illustrating the external appearance of the wireless device 100B according to the second embodiment. FIG. 13 is a cross-sectional view of the wireless device 100B according to the second embodiment. FIG. 14 is an exploded perspective view for explaining a configuration of an interposer 110B that is installed in the wireless device 100B according to the second embodiment. FIG. 15 is a planar view of the interposer 110B when viewed from the Z-axis direction illustrated in the drawings.

As illustrated in FIGS. 12 and 13, in the wireless device 100B according to the second embodiment, the semiconductor chip 101 that is mounted on the interposer 110B is sealed using the sealing resin 102; and the surfaces of the sealing resin and the side surfaces of the interposer 110B are covered by a conductive film 103. The wireless device 100B having such a configuration is called a shielding-function-equipped semiconductor package or a shielding-function-equipped semiconductor module.

The conductive film 103 is either made of a highly-conductive metal such as copper or silver or made of a conductive paste that is a mixture of a metal such as silver and an insulating material such as epoxy resin; and is formed as a film for covering the surfaces (the outside surfaces) of the sealing resin 102 and the side surfaces of the interposer 110B. Thus, in the wireless device 100B according to the second embodiment, the whole circumference of the interposer 110B, excluding the reverse surface thereof, is covered by the conductive film 103. In the following explanation, a surface of the conductive film 103 which is opposite to the component mounting surface of the interposer 110B is called the principal surface portion of the conductive film 103. Moreover, the surfaces of the conductive film 103 which are opposite to the side surfaces of the interposer 110B are called the side surface portions of the conductive film 103.

The conductive film 103 has a shielding function by which the high-frequency electromagnetic waves (in the range of few tens of MHz to few GHz) that are generated primarily from the semiconductor chip 101 are prevented from leaking in the form of radiation noise to the outside of the wireless device 100B. The shielding effectiveness attributed to the conductive film 103 is dependent on the sheet resistance value obtained by dividing the resistivity of the conductive film 103 by the thickness thereof. In order to enable reproducible prevention of the radiation noise leakage, it is desirable that the conductive film 103 has the sheet resistance value to be equal to or smaller than 0.5Ω.

Moreover, the conductive film 103 is electrically connected to the first antenna conductor pattern 120a, which is disposed in the first conductor layer 112a of the interposer 110B, and to the second antenna conductor pattern 120b, which is disposed in the second conductor layer 112b of the interposer 110B. That is, since the conductive film 103 covers not only the surfaces of the sealing resin 102 but also the side surfaces of the interposer 110B, it makes contact with the first antenna conductor pattern 120a and the second antenna conductor pattern 120b having ground potential on the side surface of the interposer 110B, and gets electrically connected to the first antenna conductor pattern 120a and the second antenna conductor pattern 120b. As a result of a low-resistance connection of the conductive film 103 to the conductor patterns having ground potential in the interposer 110B, a high shielding effectiveness can be achieved.

In the conductive film 103, an opening (hereinafter, called a shielding opening) 140 is formed that is continuous with the first opening 121a of the first antenna conductor pattern 120a and the second opening 121b of the second antenna conductor pattern 120b. The shielding opening 140, the first opening 121a, and the second opening 121b together function as a single slot antenna. More particularly, for example, as illustrated in FIG. 12, the shielding opening 140 is formed from the principal surface portion to the side surface portion of the conductive film 103. Moreover, as illustrated in FIG. 14, the first opening 121a of the first antenna conductor pattern 120a is formed in such a way that one end 122a thereof reaches the side surface of the interposer 110B; and becomes continuous with the shielding opening 140 formed in the side surface portion of the conductive film 103, at the end 122a. In an identical manner, the second opening 121b of the second antenna conductor pattern 120b is formed in such a way that one end 122b thereof reaches the side surface of the interposer 110B; and becomes continuous with the shielding opening 140 formed in the side surface portion of the conductive film 103, at the end 122b.

For example, at the time of performing patterning of the wiring pattern and ground pattern on the first conductor layer 112a of the interposer 110B, the first opening 121a is formed as a cut (slit) taken from the side surface of the interposer 110B onto the first antenna conductor pattern 120a that is disposed adjacent to the side surface of the interposer 110B. Similarly, at the time of performing patterning of the wiring pattern and ground pattern on the second conductor layer 112b of the interposer 110B, the second opening 121b is formed as a cut (slit) taken from the side surface of the interposer 110B onto the second antenna conductor pattern 120b that is disposed adjacent to the side surface of the interposer 110B.

In the wireless device 100B according to the second embodiment, in an identical manner to the wireless device 100A according to the first embodiment, the first antenna conductor pattern 120a disposed in the first conductor layer 112a of the interposer 110B has the substantially same shape as the second antenna conductor pattern 120b disposed in the second conductor layer 112b of the interposer 110B. Moreover, the first opening 121a of the first antenna conductor pattern 120a has the substantially same shape as the second opening 121b of the second antenna conductor pattern 120b. Hence, the first antenna conductor pattern 120a and the second antenna conductor pattern 120b have the substantially equal space of the conductor portion.

Furthermore, the first opening 121a of the first antenna conductor pattern 120a and the second opening 121b of the second antenna conductor pattern 120b are formed at the substantially same position in the respective antenna areas. That is, the orthogonal projection of the first opening 121a onto the second conductor layer 112b overlaps with the second opening 121b. In other words, in the planar view of the interposer 110B when viewed from the direction orthogonal to the principal surface (i.e., when viewed from the Z-axis direction illustrated in the drawings), the first opening 121a and the second opening 121b are seen to be overlapping with each other.

After the semiconductor chip 101 is mounted on the component mounting surface of the interposer 110B and is sealed using the sealing resin 102, and after the conductive film 103 is formed; the shielding opening 140 is formed by performing cutting work with respect to the principal surface portion and the side surface portion of the conductive film 103 using, for example, a laser beam machine or an end mill machining device. At that time, the shielding opening 140 is formed in the conductive film 103 in alignment with the first opening 121a, which is formed on the first antenna conductor pattern 120a, and with the second opening 121b, which is formed on the second antenna conductor pattern 120b, so that the shielding opening 140 becomes continuous with the first opening 121a and the second opening 121b.

Once the first opening 121a formed on the first antenna conductor pattern 120a, the second opening 121b formed on the second antenna conductor pattern 120b, and the shielding opening 140 formed on the conductive film 103 become continuous with each other; the first opening 121a, the second opening 121b, and the shielding opening 140 constitute a single continuous opening.

The single opening constituted by the first opening 121a, the second opening 121b, and the shielding opening 140 has the length to be substantially equal to the half wavelength of the desired frequency used for communication by the wireless device 100B. When at least either the first opening 121a or the second opening 121b (in the example illustrated in FIG. 14, the first opening 121a) receives coplanar power supply from the antenna feeder 130, the single opening constituted by the first opening 121a, the second opening 121b, and the shielding opening 140 functions as a slot antenna and becomes able to radiate or receive electromagnetic waves of the desired frequency in an efficient manner.

In the second embodiment too, in an identical manner to the first embodiment, the antenna feeder 130, the first antenna conductor pattern 120a, and the second antenna conductor pattern 120b constitute a grounded coplanar line in which the first antenna conductor pattern 120a serves as side ground and the second antenna conductor pattern 120b serves as rear ground. Since the antenna feeder 130 feeds power to the first opening 121a; as illustrated in FIG. 15, the antenna feeder 130 extends in an intersecting manner with the first opening 121a and has the leading end thereof connected to the first antenna conductor pattern 120a. Moreover, regarding the remaining portion other than the leading end of the antenna feeder 130, the gaps G are maintained in order to insulate the antenna feeder 130 from the first antenna conductor pattern 120*a*. Meanwhile, in FIGS. 14 and 15, although the base end side of the antenna feeder 130 is not illustrated, it is connected to the RF input-output of the semiconductor chip 101 via a bump or a bonding wire.

In the wireless device 100B according to the second embodiment, the first opening 121*a* and the second opening 121*b*, which are formed on the interposer 110B, and the shielding opening 140, which is formed on the conductive film 103, become continuous with each other and constitute a single slot antenna. That makes it easier to secure the length of the slot antenna. Hence, for example, even if the wireless device 100B is small in size in regard to the desired frequency used for communication, a slot antenna having the length to be substantially equal to the half wavelength of the desired frequency can be formed in an appropriate manner. Moreover, since the slot antenna is used as the radiating element, as compared to a case in which the radiating element is configured using a conductor, an excellent antenna characteristic can be achieved while minimizing the opening area on the conductive film 103; and any degradation in the shielding performance attributed to the formation of an opening in the conductive film 103, which fulfils the role of a shield, can be held down to the minimum.

Meanwhile, in the second embodiment too, in an identical manner to the first embodiment, the first conductor layer 112*a* and the second conductor layer 112*b* of the interposer 110B respectively have the first antenna conductor pattern 120*a* and the second antenna conductor pattern 120*b* disposed therein having the substantially equal area of the conductor portion. Moreover, the orthogonal projection of the first opening 121*a*, which is formed in the first antenna conductor pattern 120*a*, onto the second conductor layer 112*b* overlaps with the second opening 121*b* formed in the second antenna conductor pattern 120*b*. Thus, according to the second embodiment, the metal coverage rates of the first conductor layer 112*a* and the second conductor layer 112*b* of the interposer 110B can be maintained at a comparable level without causing significant deterioration in the antenna characteristic of the slot antenna. As a result, an excellent antenna characteristic can be achieved along with achieving a decrease in the warpage of the interposer 110B.

If warpage occurs in the interposer 110B, not only it becomes difficult to perform singulation (dicing) of the interposer 110B, but it also becomes difficult to perform the processing for forming the shielding opening 140 in the conductive film 103, and the shielding opening 140 becomes susceptible to misalignment. As a result, the first opening 121*a* and the second opening 121*b*, which are formed in the interposer 110B, become non-continuous with the shielding opening 140, and may not function as a shielding antenna. In contrast, in the wireless device 100B according to the second embodiment, since the warpage of the interposer 110B gets reduced, the unfavorable situation explained above can be effectively prevented and a sophisticated wireless device 100B can be achieved.

Meanwhile, in an identical manner to the first modification of the first embodiment, in the second embodiment too, the interposer 110B having three or more conductor layers can be used. Moreover, in an identical manner to the second modification of the first embodiment, in the second embodiment too, the configuration can be such that the orthogonal projection P (see FIG. 8) of the first opening 121*a*, which is formed in the interposer 110B, onto the second conductor layer 112*b* falls within the second opening 121*b*. Furthermore, in an identical manner to the third modification of the first embodiment, in the second embodiment too, the first antenna conductor pattern 120*a*, which is formed in the first conductor layer 112*a* of the interposer 110B, and the second antenna conductor pattern 120*b*, which is formed in the second conductor layer 112*b* of the interposer 110B, can be electrically connected using the conductive via holes 150.

According to at least one of the embodiments described above, the warpage of the interposer can be held down in an effective manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless device comprising:
an interposer comprising a plurality of conductor layers;
a semiconductor chip mounted on the interposer and comprising a built-in transceiver circuit; and
a non-conductor placed on the interposer, wherein the non-conductor seals the semiconductor chip, wherein
from among the plurality of conductor layers of the interposer, a first conductor layer and a second conductor layer are symmetrically positioned with respect to center in a thickness direction of the interposer, the first conductor layer having a first antenna conductor pattern disposed therein and the second conductor layer having a second antenna conductor pattern disposed therein, the first antenna conductor pattern and the second antenna conductor pattern having substantially equal area,
the first antenna conductor pattern having a first opening formed therein and the second antenna conductor pattern having a second opening formed therein, the first opening and the second opening functioning as a slot antenna, and
an orthogonal projection of the first opening onto the second conductor layer overlaps with the second opening.

2. The device according to claim 1, wherein the orthogonal projection of the first opening onto the second conductor layer is within the second opening.

3. The device according to claim 1, further comprising a conductive film that covers surfaces of a sealing resin and side surfaces of the interposer, and that is electrically connected to the first antenna conductor pattern and to the second antenna conductor pattern, wherein
the conductive film has an opening formed therein that is continuous with the first opening and the second opening, and the opening formed in the conductive film, the first opening, and the second opening function as a single slot antenna.

4. The device according to claim 1, wherein at least one of the first opening and the second opening receives a coplanar power supply from a feeder disposed either in the first conductor layer or the second conductor layer.

5. The device according to claim 1, wherein at least one of the first opening and the second opening receives an electromagnetic coupling power supply from a feeder disposed in another conductor layer different from the first conductor layer or the second conductor layer.

6. The device according to claim 1, wherein conductive via holes are disposed around the first opening and the second opening across the first conductor layer and the second conductor layer, and the first antenna conductor pattern and the second antenna conductor pattern are electrically connected via the conductive via holes.

* * * * *